United States Patent
Yasuda et al.

(10) Patent No.: US 11,162,176 B2
(45) Date of Patent: Nov. 2, 2021

(54) FLUID CONTROL APPARATUS, FLUID CONTROL SYSTEM, FLUID CONTROL METHOD, AND PROGRAM RECORDING MEDIUM

(71) Applicant: HORIBA STEC, Co., Ltd., Kyoto (JP)

(72) Inventors: Tadahiro Yasuda, Irvine, CA (US); Thomas Hoke, Irvine, CA (US)

(73) Assignee: HORIBA STEC, Co., Ltd., Kyoto (JP)

( * ) Notice: Subject to any disclaimer, the term of this patent is extended or adjusted under 35 U.S.C. 154(b) by 272 days.

(21) Appl. No.: 16/031,952

(22) Filed: Jul. 10, 2018

(65) Prior Publication Data

US 2019/0017172 A1    Jan. 17, 2019

(30) Foreign Application Priority Data

Jul. 11, 2017 (JP) .............................. JP2017-135676

(51) Int. Cl.
  *G05B 6/02* (2006.01)
  *C23C 16/52* (2006.01)
  *C23C 16/455* (2006.01)

(52) U.S. Cl.
  CPC ........ *C23C 16/52* (2013.01); *C23C 16/45544* (2013.01); *C23C 16/45557* (2013.01); *G05B 6/02* (2013.01)

(58) Field of Classification Search
  CPC ... B05B 1/3006; Y10T 137/0379; G05B 6/03; G05B 6/02; C23C 16/45557
  See application file for complete search history.

(56) References Cited

U.S. PATENT DOCUMENTS 9,151,731 B2 * 10/2015 Heitz ................. G01N 33/0006
10,031,531 B2 * 7/2018 Ding .................... G05D 11/132
(Continued)

FOREIGN PATENT DOCUMENTS

CN         1432147 A      7/2003
CN       105320161 A      2/2016
(Continued)

OTHER PUBLICATIONS

Japan Patent Office, Office Action Issued in Application No. 2017135676, dated May 13, 2021, 8 pages.
(Continued)

*Primary Examiner* — Gary Collins
(74) *Attorney, Agent, or Firm* — Alleman Hall Creasman & Tuttle LLP

(57) ABSTRACT

Provided is a fluid control apparatus that without enhancing temporal control performance, every time, can stabilize a fluid flow rate achieved by, for example, pulse control, and eliminate fluid wasted at the time of supplying the fluid by including one flow path. A control mechanism includes a first feedback controller adapted to control a first valve on the basis of first pressure measured by a first pressure sensor. In addition, when a second valve is closed, the first pressure feedback controller controls the first valve so that the first pressure measured by the first pressure sensor reaches target burst pressure, and when and after the first pressure reaches the target burst pressure and the second valve is opened, the control mechanism is configured to control the first valve so that the flow rate of the fluid flowing through the flow path reaches a target constant flow rate.

9 Claims, 9 Drawing Sheets

(56) References Cited

U.S. PATENT DOCUMENTS

| | | | | |
|---|---|---|---|---|
| 2004/0244837 A1* | 12/2004 | Nawata | ............... | G05D 7/0647 |
| | | | | 137/487.5 |
| 2009/0112504 A1* | 4/2009 | Ding | ...................... | G01F 22/02 |
| | | | | 702/100 |
| 2014/0034164 A1* | 2/2014 | Yasuda | ............... | G05D 7/0617 |
| | | | | 137/599.01 |
| 2015/0314307 A1* | 11/2015 | Ruttenberg | ............ | B05B 1/086 |
| | | | | 137/12 |
| 2016/0041564 A1 | 2/2016 | Mudd et al. | | |
| 2018/0090353 A1* | 3/2018 | Penley | .............. | H01L 21/67017 |
| 2018/0283914 A1* | 10/2018 | Sugita | ....................... | G01F 1/50 |

FOREIGN PATENT DOCUMENTS

| | | |
|---|---|---|
| JP | S60-153312 U | 10/1985 |
| JP | 05-233068 A | 9/1993 |
| JP | 2007034667 A | 2/2007 |
| JP | 2011524589 A | 9/2011 |
| JP | 2014-013461 A | 1/2014 |
| JP | 2014190452 A | 10/2014 |
| JP | 2017509793 A | 4/2017 |
| WO | 0173820 A2 | 10/2001 |
| WO | 2010005601 A2 | 1/2010 |
| WO | 2015138073 A1 | 9/2015 |
| WO | 2017051520 A1 | 3/2017 |

OTHER PUBLICATIONS

China National Intellectual Property Administration, Office Action and Search Report Issued in Application No. 201810744359.8, dated Jun. 3, 2021, 14 pages.

Japan Patent Office, Decision of Refusal Issued in Application No. 2017-135676, dated Aug. 10, 2021, 12 pages.

* cited by examiner

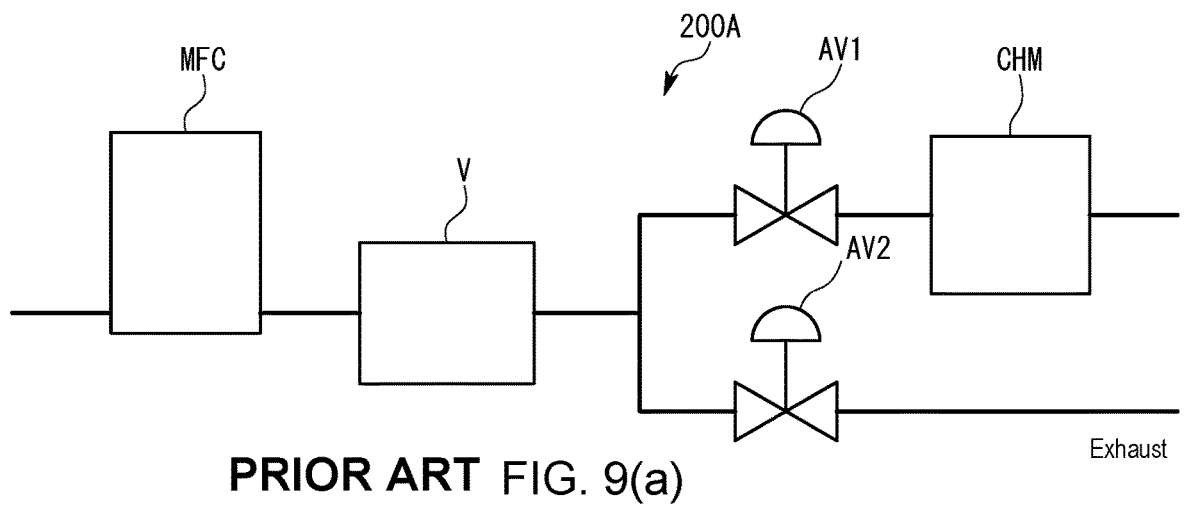
PRIOR ART FIG. 9(a)
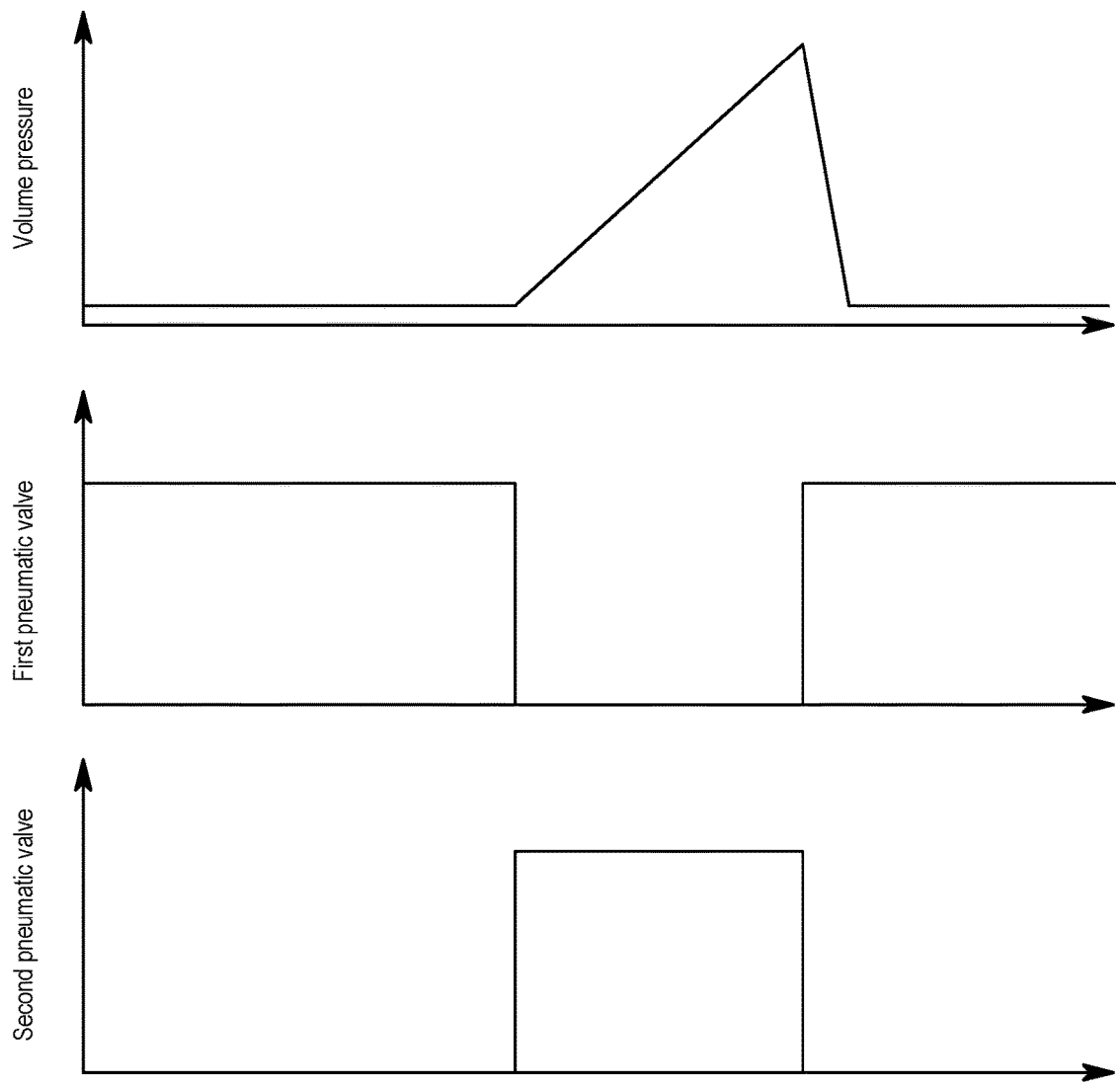
PRIOR ART FIG. 9(b)

FLUID CONTROL APPARATUS, FLUID CONTROL SYSTEM, FLUID CONTROL METHOD, AND PROGRAM RECORDING MEDIUM

TECHNICAL FIELD

The present invention relates to a fluid control apparatus used to control the amount of fluid of each of various gases in, for example, a semiconductor manufacturing apparatus.

BACKGROUND ART

For example, an atomic layer deposition (ALD) apparatus which is a kind of semiconductor deposition apparatus is intended to deposit a film having a thickness of the order of angstroms by alternately introducing component gas and water vapor gas only for a short time each.

Therefore, in order to make it possible to introduce required flow rates of various gases for depositing a film of, for example, one atomic layer into a deposition chamber, a fluid control system for controlling the flow rates of the various gases to be introduced into the deposition chamber is driven by pulse control adapted to switch on/off a valve in a short time (see Patent Literature 1).

As illustrated in FIG. 9(a), a fluid control system 200A used in an ALD process is provided in a flow path structure having two branch flow paths branching from the downstream end part of a main flow path. The main flow path is provided with a mass flow controller for flow rate feedback control and a volume V. Also, a first branch flow path is connected to a deposition chamber CHM, and on the upstream side of the deposition chamber CHM, a first pneumatic valve AV1 is provided. In addition, a second branch flow path is connected to an exhaust flow path, and provided with a second pneumatic valve AV2.

In the fluid control system 200A configured as described above, the mass flow controller MFC performs the flow rate feedback control so that the flow rate of gas flowing into the volume V is always kept constant at a target flow rate. Also, as illustrated in FIG. 9(b), pulse control is repeated, in which the motions of the first and second pneumatic valves AV1 and AV2 synchronize with each other so that when the first pneumatic valve AV1 is opened, the second pneumatic valve AV2 is closed, and when the first pneumatic valve AV1 is closed, the second pneumatic valve AV2 is opened. It is considered that in this manner, the gas having the same pressure can be periodically charged into the volume V, and supplied to the deposition chamber CHM at the same flow rate.

However, the control as described above requires the premise that the pneumatic valves can respond to a command value at high speed, and the speed of the response is always constant. For example, the pneumatic valves operate upon receipt of air supply from a compressed air supply source in a factory. However, the compressed air supply source is shared by devices other than the pneumatic valves, and therefore supply pressure may vary at each time of operation. For this reason, the response characteristics of the pneumatic valves at the time of opening or closing may be different at each time of operation. As a result, the time when each of the pneumatic valves is opened or closed is not necessarily always constant, and therefore there occurs a problem that the flow rate of the gas to be supplied to the deposition chamber is not constant at each pulse.

As described, depending on the temporal control accuracy of each control device, the flow rate accuracy of the gas to be supplied to the deposition chamber is determined. However, it is currently difficult to obtain temporal control accuracy required for high-speed pulse control as in ALD.

In addition, also required is to enhance robustness so that even when disturbance occurs, such as a variation in pressure occurring while the first pneumatic valve is being opened, the flow rate is kept constant. However, since the pneumatic valve is an on-off valve, it is also difficult to respond to such a requirement.

Further, in the above-described fluid control system, while the gas is not being supplied to the deposition chamber, part of the gas having passed through the mass flow controller is exhausted through the second pneumatic valve, and wasted without being supplied to the deposition chamber.

In addition, in the above-described fluid control system, the two branch flow paths are required, and there is also a problem of causing increases in size and complication.

CITATION LIST

Patent Literatures

Patent Literature 1: Japanese Unexamined Patent Application Publication No. 2017-509793

SUMMARY OF INVENTION

Technical Problem

The present invention has been made in order to solve the problems as described above at once, and intends to provide a fluid control apparatus that without enhancing temporal control performance, every time, can stabilize a fluid flow rate achieved by, for example, pulse control, and eliminate fluid wasted at the time of supplying the fluid by being configured to include one flow path.

Solution to Problem

That is, the fluid control apparatus according to the present invention is one including: a fluid device module provided on the upper stream side than a second valve provided in a flow path; and a control mechanism adapted to control at least a part of the fluid device module. In addition, the fluid device module includes: a fluid resistor provided on the upper stream side than the second valve; a first pressure sensor provided on the upper stream side than the fluid resistor; and a first valve provided on the upper stream side than the first pressure sensor, the control mechanism includes a first feedback controller adapted to control the first valve on the basis of first pressure measured by the first pressure sensor, and when the second valve is closed, the first pressure feedback controller controls the first valve so that the first pressure measured by the first pressure sensor reaches target burst pressure. Further, when and after the first pressure reaches the target burst pressure and the second valve is opened, the control mechanism is configured to control the first valve so that the flow rate of fluid flowing through the flow path reaches a target constant flow rate.

Also, a fluid control method according to the present invention is one using a fluid control apparatus including: a fluid device module provided on the upper stream side than a second valve provided in a flow path; and a control mechanism adapted to control at least a part of the fluid device module, in which the fluid device module includes: a fluid resistor provided on the upper stream side than the second valve; a first pressure sensor provided on the upper stream side than the fluid resistor; and a first valve provided on the upper stream side than the first pressure sensor. In addition, when the second valve is closed, the fluid control method controls the first valve so that first pressure measured by the first pressure sensor reaches target burst pressure, and when and after the first pressure reaches the target burst pressure and the second valve is opened, controls the first valve so that the flow rate of fluid flowing through the flow path reaches a target constant flow rate.

In such configurations, the first pressure feedback controller controls the first valve, and thereby when the second valve is closed, the fluid can be charged into the volume of the flow path from the first valve to the second valve at the target burst pressure. For this reason, before the second valve is opened, the same pressure can be achieved every time, and the peak flow rate of the fluid flowing as impulse-like burst flow when the second valve is opened can be regulated to substantially the same value every time.

In other words, a fluid charge state before the second valve is opened does not depend on transient response characteristics that is the temporal control characteristics of the second valve, and therefore the repeat accuracy of pressure charge can be more improved than before.

Further, since when and after the second valve is opened, the control mechanism controls the first valve so that the flow rate of the fluid flowing through the flow path reaches the target constant flow rate, after the occurrence of the impulse-like burst flow, even under the presence of disturbance or the like, the flow rate of the fluid can be maintained, and therefore the robustness of flow rate control can be enhanced.

In addition, the above configurations require only one flow path, thus making it possible to simplify a flow path configuration, and when closing the second valve to charge the fluid to the target burst pressure, the fluid to be exhausted and wasted can be eliminated.

Specific control embodiments for keeping the flow rate of the fluid constant at the target flow rate after the second valve has been opened to cause the burst flow include one in which the fluid device module further includes a second pressure sensor provided on the lower stream side than the fluid resistor and on the upper stream side than the second valve, the control mechanism further includes: a flow rate calculator adapted to calculate the flow rate of the fluid flowing through the flow path on the basis of the first pressure measured by the first pressure sensor and second pressure measured by the second pressure sensor; and a flow rate feedback controller adapted to control the first valve on the basis of a measured flow rate calculated by the flow rate calculator, and when and after the first pressure reaches the target burst pressure and the second valve is opened, the flow rate feedback controller controls the first valve so that the measured flow rate reaches the target constant flow rate.

When switching from pressure feedback control based on the first pressure to flow rate feedback control based on the measured flow rate, in order to make the flow rate of the fluid flowing through the flow path less likely to vary and thereby more increase control accuracy, it is only necessary that when and after the second valve is closed and the first pressure reaches the target burst pressure, the first pressure feedback controller controls the first valve so that the first pressure reaches target maintenance pressure corresponding to the target constant flow rate and lower than the target burst pressure.

When charging the target burst pressure into the volume of the flow path from the first valve to the second valve, in order to make it possible to, at the start of the charge, fully open the first valve to flow a more amount of the fluid into the volume, and after approaching the target burst pressure, gradually close the first valve to promptly charge the target burst pressure into the entire volume, it is only necessary that the control mechanism further includes a second pressure feedback controller adapted to, before the first pressure feedback controller controls the first valve, control the first valve on the basis of the second pressure measured by the second pressure sensor, and when and after the first pressure reaches pressure higher than the target burst pressure, the first pressure feedback controller controls the first valve so that the first pressure reaches the target burst pressure.

In order to make it possible to charge pressure at high speed while preliminarily preventing the inflow of a more amount of the fluid than an amount necessary to achieve the target burst pressure in the entire volume of the flow path from the first valve to the second valve, it is necessary that when the mass of the fluid flowing into the charge volume from the first valve to the second valve, which is calculated on the basis of the first pressure and the second pressure, reaches target mass calculated on the basis of the target burst pressure, the first pressure feedback controller starts to control the first valve so that the first pressure reaches the target burst pressure.

In order to make it possible to synchronize the timing when the target burst pressure is charged into the volume and the timing when the second valve is opened with each other to cause the burst flow always in the same state, it is only necessary that the control mechanism further includes a second valve controller adapted to control the second valve, and the second valve controller is configured to open the second valve when and after the first pressure feedback controller controls the first valve and thereby the first pressure reaches the target burst pressure.

A fluid control system including the fluid control apparatus according to the present invention and the second valve is capable of achieving fluid control characteristics necessary in applications such as ALD.

In order to make it possible for an existing fluid control apparatus to exhibit equivalent performance to the fluid control apparatus according to the present invention by, for example, updating a program, it is only necessary to use a program used for a fluid control apparatus including: a fluid device module provided on an upper stream side than a second valve provided in a flow path; and a control mechanism adapted to control at least a part of the fluid device module, in which the fluid device module includes: a fluid resistor provided on the upper stream side than the second valve; a first pressure sensor provided on the upper stream side than the fluid resistor; a second pressure sensor provided on the lower stream side than the fluid resistor and on the upper stream side than the second valve; and a first valve provided on the upper stream side than the first pressure sensor. In addition, the program instructs a computer to fulfill a function as a first valve controller adapted to control the first valve, in which the first valve controller includes a first pressure feedback controller adapted to control the first valve on the basis of first pressure measured by the first pressure sensor. Further, when the second valve is closed, the first pressure feedback controller controls the first valve so that the first pressure measured by the first pressure sensor reaches target burst pressure, and when and after the first pressure reaches the target burst pressure and the second valve is opened, the first valve controller controls the first valve so that a measured flow rate reaches a target constant flow rate.

In addition, the program for the fluid control apparatus may be electronically distributed or stored in a program recording medium such as a CD, DVD, HDD, or flash memory.

Advantageous Effects of Invention

As described above, the fluid control apparatus according to the present invention can perform the pressure feedback control on the basis of the first pressure so as to achieve the target burst pressure when the second valve is closed, and after the second valve has been opened to cause the burst flow, perform the flow rate feedback control based on the measured flow rate. Accordingly, independently of the temporal control characteristics of the fluid device module, the same burst pressure can be charged to cause the burst flow in the same state every time. In addition, after the occurrence of the burst flow, the first valve operates so as to keep the target constant flow rate, and therefore robustness against disturbance can be exhibited.

In addition, the fluid control apparatus according to the present invention does not require multiple lines, thus making it possible to simplify a flow path configuration, as well as eliminate the fluid to be exhausted and wasted in order to charge the target burst pressure

BRIEF DESCRIPTION OF DRAWINGS

FIGS. 9(*a*) and (*b*) are schematic diagrams illustrating a conventional fluid control system and the operation of it.

DESCRIPTION OF EMBODIMENTS

A fluid control apparatus 100 and a fluid control system 200 according to a first embodiment of the present invention will be described with reference to respective drawings.

The fluid control system 200 of the first embodiment is one that performs pulse control to intermittently supply various gases to a deposition chamber of an atomic layer deposition apparatus (hereinafter also referred to as an ALD). For example, component gas such as TMA referred to as a precursor and water vapor gas are alternately supplied to the deposition chamber of the ALD. For this purpose, one fluid control system 200 is provided in each of a flow path for supplying TMA and a flow path for supplying the water vapor gas. In the following description, while focusing on one of the flow paths, the fluid control device 100 and the fluid control system 200 will be described in detail.

Figure 1:
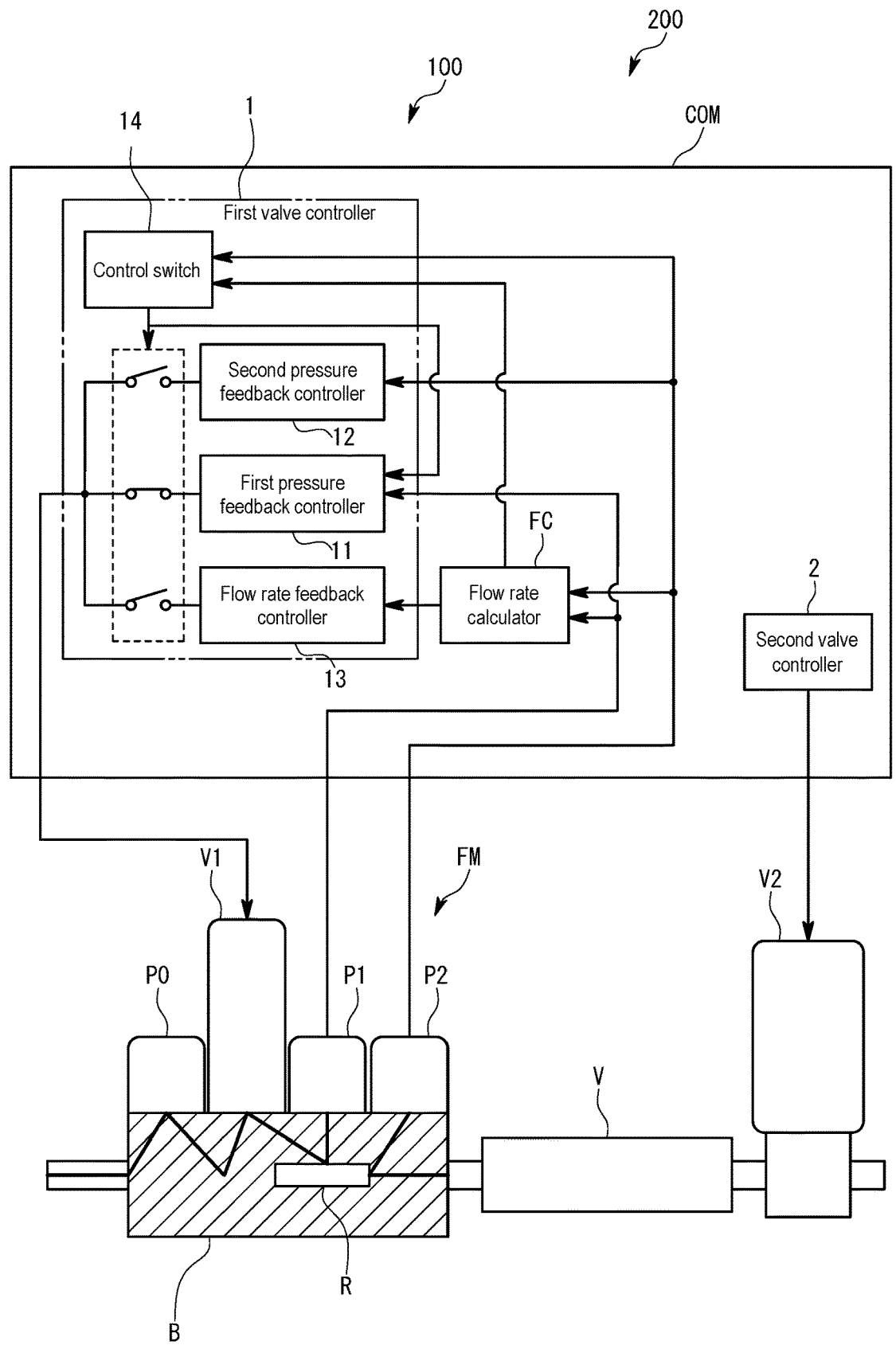
FIG. 1 is a schematic diagram illustrating a fluid control apparatus and a fluid control system according to a first embodiment of the present invention.

As illustrated in FIG. 1, the fluid control system 200 includes: a second valve V2 provided in a flow path; and a fluid control apparatus 100 having a fluid device module FM provided on the upper stream side than the second valve V2 in the flow path, and a control mechanism COM adapted to control at least a part of the fluid device module FM.

Figure 2:
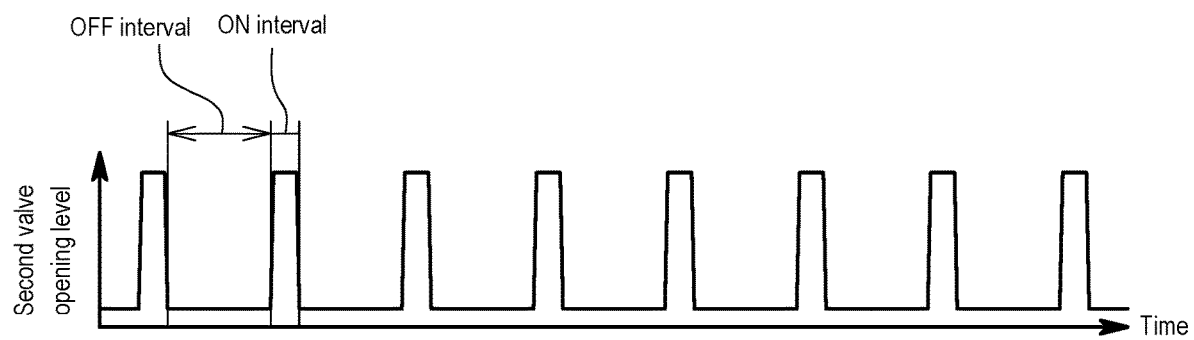
FIG. 2 is a schematic graph illustrating pulse control operation of a second valve in the first embodiment.

As illustrated in FIG. 2, the second valve V2 is one that is repeatedly opened/fully closed by the pulse control adapted to repeat ON/OFF with a predetermined period. For example, a pulse width during an ON interval is set to the order of 10 ms, and the overall period is set to the order of 100 ms. In the ALD, such pulse control is repeated, for example, 1000 cycles to form a semiconductor layer consisting of 1000 atomic layers on a substrate. The second valve V2 only has to be an on-off valve, and may be, for example, a pneumatic valve whose responsiveness is improved to be suitable for an ALD process or a piezo valve using a piezo actuator.

Figure 3:
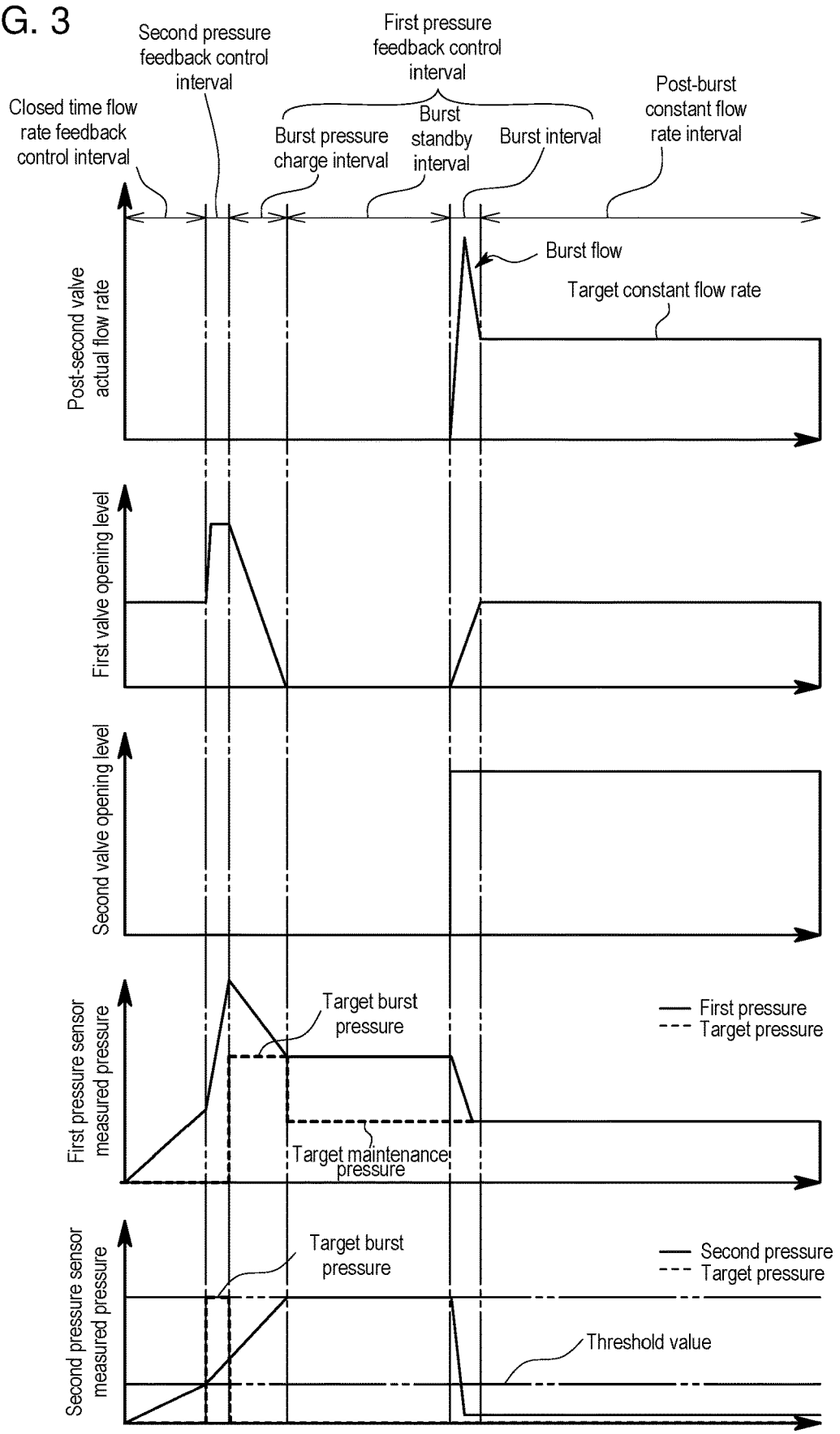
FIG. 3 is a timing chart illustrating various control parameters and the operation of a first valve before and after the second valve is opened in the first embodiment.

The fluid control apparatus 100 performs control as illustrated in a graph of FIG. 3 so that substantially the same flow rate of gas flows during every ON interval when the second valve V2 is opened. Specifically, the fluid control apparatus 100 operates so as to charge target burst pressure to the upstream side of the second valve V2 during an OFF interval when the second valve V2 is closed. On the other hand, during an ON interval when the second valve V2 is opened, the fluid control apparatus 100 operates so that the gas flows at a target constant flow rate after the occurrence of impulse-like burst flow.

In the following, a specific configuration of the fluid control apparatus 100 will be described in detail.

As illustrated in FIG. 1, the fluid device module FM of the fluid control apparatus 100 is one assembled by attaching multiple devices to a block B formed with an internal flow path. The fluid device module FM is assembled as a unit separately from the second valve V2, and adapted such that the block B is attached to the flow path. Also, between the fluid device module FM and the second valve V2, a downstream side volume V adapted to store the gas as fluid when the second valve V2 is closed is arranged. The downstream side volume V is, for example, a part of the flow path whose diameter is formed to be larger than the other piping part.

In the fluid device module FM, the block B is provided with a supply pressure sensor P0, first valve V1, first pressure sensor P1, fluid resistor R, and second pressure sensor P2 sequentially from the upstream side.

The supply pressure sensor P0 is one that monitors the supply pressure of the component gas or the water vapor gas supplied from the upstream side.

The first valve V1 is one whose valve body is driven by, for example, a piezo actuator to control the opening level between the valve body and a valve seat.

The fluid resistor R is, for example, a laminar flow element, and used to form the differential pressure between before and after it and measure the flow rate of the gas flowing through the flow path. That is, the first pressure sensor P1 and the second pressure sensor P2 are configured to be capable of calculating the flow rate on the basis of first pressure and second pressure for measuring the differential pressure between before and after the fluid resistor R.

The first pressure sensor P1 is one that as the first pressure, measures the pressure of the gas flowing into a first volume that is the volume of the flow path between the first valve V1 and the fluid resistor R.

The second pressure sensor P2 is one that as the second pressure, measures the pressure of the gas flowing into a second volume that is arranged between the second valve V2 and the downstream side volume V and the volume of the flow path from the fluid resistor R to the second valve V2.

The first pressure and the second pressure are used not only to calculate the measured flow rate but to control the first valve V1 independently as described below.

The control mechanism COM is one that is configured to include a so-called computer including a CPU, memory, A/D and D/A converters, input/output means, and the like, and fulfills functions as at least a flow rate calculator FC, a first valve controller 1, and a second valve controller 2 by executing a program for the fluid control apparatus stored in the memory to operate various devices together.

The flow rate calculator FC calculates the flow rate of the gas flowing through the flow path on the basis of the first pressure measured by the first pressure sensor P1 and the second pressure measured by the second pressure sensor P2. As a flow rate calculation expression, various known expressions can be used.

The first valve controller 1 is one that controls the opening level of the first valve V1 by, for example, changing applied voltage. The first valve controller 1 is configured such that the type of a value to be fed back or a target value is changed at every predetermined timing to switch a control mode. Such switching of the control mode allows, after the occurrence of the burst flow during an ON interval when the second valve V2 is opened, the gas to be flowed with the constant flow rate maintained. Note that the burst flow refers to the flow of the gas that is charged in the volume of the flow path during an OFF interval when the second valve V2 is closed and flows out all at once at the point when the second valve V2 is opened. The burst flow has the peak flow rate larger in value than the constant flow rate kept after the occurrence of the burst flow, and is kept for a short time. For example, in the first embodiment, the value of the peak flow rate of the gas flowing as the burst flow is twice or more the value of the constant flow rate.

More specifically, the first valve controller 1 includes a first pressure feedback controller 11, second pressure feedback controller 12, flow rate feedback controller 13, and control switch 14.

The control switch 14 is one that makes any one of the first pressure feedback controller 11, second pressure feedback controller 12, and flow rate feedback controller 13 control the first valve V1. On the basis of the measured flow rate inputted from the flow rate calculator FC and the second pressure inputted from the second pressure sensor P2, the control switch 14 switches the control of the first valve V1 every time determination conditions are met. In addition, the details of the determination conditions and the like will be described together with the description of operation below.

The first pressure feedback controller 11 is one that controls the first valve V1 on the basis of the first pressure measured by the first pressure sensor P1. More specifically, the first pressure feedback controller 11 controls the opening level of the first valve V1 so as to decrease the deviation between setting target pressure and the first pressure. In addition, in the first embodiment, as the target pressure, at least two types are set, i.e., the target burst pressure and target maintenance pressure, and when control conditions are satisfied, the target pressure is appropriately changed by the control switch 14. Note that the target burst pressure refers to the target value of the pressure of the gas charged in the volume in the flow path when the second valve V2 is closed, and is set depending on the value of the peak flow rate of the gas desired to flow as the burst flow. Also, the target maintenance pressure refers to the target value of the pressure of the gas set depending on the constant flow rate maintained after the occurrence of the burst flow. Since the value of the peak flow rate of the gas flowing as the burst flow is set to be larger than the value of the constant flow rate, the target burst pressure is set to higher pressure than the target maintenance pressure. In addition, the first pressure feedback controller 11 controls the opening level of the first valve V1 before and after the second valve V2 is opened.

The second pressure feedback controller 12 is one that controls the first valve V1 on the basis of the second pressure measured by the second pressure sensor P2. More specifically, the second pressure feedback controller 12 controls the opening level of the first valve V1 so as to decrease the deviation between setting target pressure and the second pressure. Also, the second pressure feedback controller 12 controls the opening level of the first valve V1 until the gas having a predetermined gas flows into the volume from the first valve V1 to the second valve V2 when the second valve V2 is closed.

The flow rate feedback controller 13 is one that controls the first valve V1 on the basis of the measured flow rate calculated by the flow rate calculator FC. More specifically, the flow rate feedback controller 13 controls the opening level of the first valve V1 so as to decrease the deviation between a setting target flow rate and the measured flow rate. Also, the flow rate feedback controller 13 controls the first valve V1 when neither the first pressure feedback controller 11 nor the second pressure feedback controller 12 controls the first valve 1.

The second valve controller 2 is one that controls the ON/OFF timing of the second valve V2, and performs the pulse control adapted to repeat ON/OFF with, for example, a predetermined period. More specifically, the ON/OFF timing of the second valve V2 is set so that the second valve controller 2 closes the second valve V2 until the target burst pressure is charged in the volume of the flow path from the first valve V1 to the second valve V2 by the fluid control apparatus 100, and after a predetermined time has passed since the completion of the charge, opens the second valve V2. In addition, the second valve controller 2 may be adapted to, for example, when the first pressure measured by the first pressure sensor P1 is kept at the target burst pressure for a predetermined interval, open the second valve V2 after a predetermined standby time. That is, the second valve controller 2 may be configured to operate with the first pressure, second pressure, or measured for rate as a trigger.

Next, the control operation of the fluid control system 200 of the first embodiment configured as described above during one cycle will be described with reference to a timing chart of FIG. 3 and a flowchart of FIG. 4. In the following, the description will be given while focusing on operation during the interval from when the second valve V2 is closed to start an OFF interval to when the second valve V2 is opened and then again closed.

Figure 4:
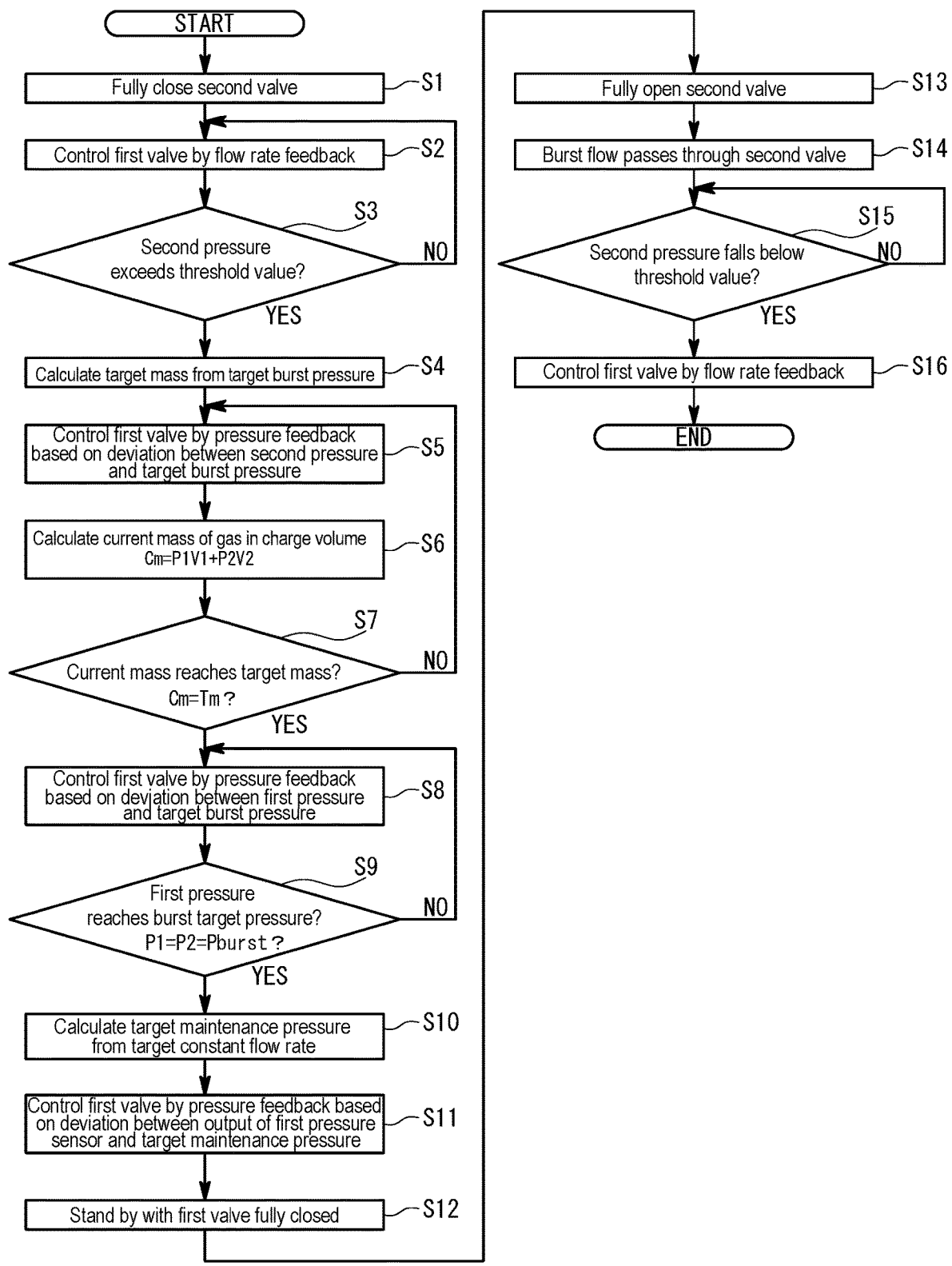
FIG. 4 is a flowchart illustrating the operation of the fluid control apparatus and that of the fluid control system in the first embodiment.

As illustrated in FIG. 4, when the second valve V2 is closed (Step S1), the first valve controller 1 makes the flow rate feedback controller 13 control the first valve V1 so as to maintain the target maintenance flow rate (Step S2). As indicated by a closed time flow rate feedback control interval of FIG. 3, while the second valve V2 is being closed, the opening level of the first valve V1 is controlled by flow rate feedback control, and the gas flowing into the volume between the first valve V1 and the second valve V2 increases the first and second pressures. As illustrated in FIG. 4, the control switch 14 determines whether or not the second pressure exceeds a threshold value (Step S3), and when the second pressure does not exceed the threshold value, the operation of controlling the first valve V1 in Step S2 is continued by flow rate feedback.

On the other hand, when the second pressure exceeds the threshold value, the control switch 14 calculates target mass Tm on the basis of the target burst pressure set by a user and the volume of the flow path from the first valve V1 to the second valve V2 (Step S4). Note that the target mass Tm is set to, for example, a value smaller by a predetermined percentage than the ideal mass of the gas filled when the pressure in the entire volume of the flow path from the first valve V1 to the second valve V2 reaches the target burst pressure. That is, at the point when the target mass Tm is reached, even when the pressure in part of the volume is the target burst pressure or more, the target burst pressure is not reached as a whole on average. The target mass Tm can be calculated by multiplying, by the target burst pressure, the sum of the volume of the first volume from the first valve V1 to the fluid resistor R calculated from the design values of the fluid control apparatus 100, the value of the volume from the fluid resistor R to the outlet of the block B calculated from the design values of the fluid control apparatus 100, and the volume of the second volume from the fluid resistor R to the second valve V2 calculated from the value of the volume of the downstream side volume V set by the user.

Further, the control switch 14 switches from the control of the first valve V1 by the flow rate feedback controller 13 to the control of the first valve 1 by the second pressure feedback controller 12 (Step S5). As indicated by a second pressure feedback control interval of FIG. 3, the deviation between the target burst pressure and the second pressure is large, and therefore the second pressure feedback controller 12 keeps the first valve V1 in substantially a fully opened state. Accordingly, the gas flows into the volume at the maximum flow rate, and therefore the pressure in the volume can be rapidly increased.

As illustrated in FIG. 4, while the second pressure feedback controller 12 is continuing the control, the control switch 14 calculates the current mass of the gas flowing into the volume (Step S6). Note that the current mass of the gas is calculated as the sum of a value obtained by multiplying the volume of the first volume by the first pressure currently measured and a value obtained by multiplying the volume of the second volume by the second pressure currently measured.

Further, the control switch 14 compared the current mass Cm and the target mass Tm (Step S7), and when the current mass Cm does not reach the target mass Tm, the operation in Steps S5 and S6 is continued. At the point when the current mass Cm takes the same value as that of the target mass Tm, the control switch 14 switches from the control of the first valve V1 by the second pressure feedback controller 11 to the control of the first valve V1 by the first pressure feedback controller 11 (Step S8). As can be seen from the start point of a burst pressure charge interval of a first pressure feedback control interval in FIG. 3, at the point when the control is switched, the first pressure exceeds the target burst pressure, but the second pressure does not reach the target burst pressure. This is because since the gas first flows into the first volume on the upper stream side than the fluid resistor R, the pressure in the second volume increases late, and the first valve V1 is controlled on the basis of the second pressure on the lower stream side of the fluid resistor R. That is, since the first valve V1 is controlled on the basis of the second pressure, even when the pressure in the first volume first reaches the target burst pressure, the opening level of the first valve V1 is not decreased but maintained so as to achieve the target burst pressure or more. In doing so, the gas is rapidly flowed into the volume, and thereby the time necessary for the entire volume to have the target burst pressure is shortened.

Also, at the point when the control of the first valve V1 by the first pressure feedback controller 11 is started, the first pressure is higher than the target burst pressure, and therefore the first valve V1 is controlled in a direction to be closed.

As a result, the amount of the gas flowing in gradually decreases, and also the gas in the first volume moves to the second volume. As illustrated in FIG. 4, during this change, the control switch 14 determines whether or not the first pressure (second pressure) reaches the target burst pressure (Step S9). When the first pressure does not reach the target burst pressure, the operation in Step S8 is continued, and at the point when the first pressure reaches the target burst pressure, the second valve V2 is opened, and the target maintenance pressure that is pressure corresponding to the target constant flow rate kept after the occurrence of the burst flow is calculated (Step S10). For example, when the second valve V2 is opened, the downstream side of the fluid resistor R connected to the deposition chamber is kept substantially vacuum, and therefore the target maintenance pressure necessary to achieve the target constant flow rate can be calculated on the basis of a flow rate calculation expression.

Further, the control switch 14 sets the calculated target maintenance pressure in the first pressure feedback controller 11 as the target pressure, and switches control so that the first valveV1 is controlled so as to decrease the deviation between the target maintenance pressure and the first pressure (Step S11). That is, as indicated by a burst standby interval of FIG. 3, the target maintenance pressure is set to lower pressure than the first pressure, and therefore as illustrated in FIGS. 3 and 4, the first valve V1 is kept fully closed (Step S12).

As indicated by the burst standby interval of FIG. 3, after a state where both the first pressure and the second pressure are kept at the target burst pressure has been continued for a predetermined time, as illustrated in FIGS. 3 and 4, the second valve controller 2 opens the second valve V2 (Step S13), and as a result, the impulse-like burst flow occurs (Step S14). Also, in a burst interval of FIG. 3 as well, the first pressure feedback controller 11 operates so as to keep the first pressure at the target maintenance pressure.

In the burst interval, the control switch 14 determines whether or not the second pressure falls below the threshold value (Step S15), and when the second pressure falls below the threshold value, the control switch 14 switches from the control of the first valve V1 by the first pressure feedback controller 11 to the control of the first valve V1 by the flow rate feedback controller 13 (Step S16). As indicated by a post-burst flow rate constant interval of FIG. 3, since the first pressure is controlled to be the target maintenance pressure corresponding to the target constant flow rate in advance, and exhibits almost no variation at the point when the burst flow rate decreases to the target constant flow rate, and therefore the control can be switched.

By repeating the operation from Steps S1 to S16 as described above on a cycle basis, the flow rates of the gas flowing during respective ON intervals appearing in each cycle are controlled to be substantially the same.

In the fluid control system 200 and the fluid control apparatus 100 configured as described above, since during the interval when the second valve V2 is closed, the pressure feedback allows the gas to be charged into the volume of the flow path from the first valve V1 and the second valve V2 so as to achieve the target burst pressure, the peak flow rate of the gas flowing as the burst flow when the second valve V2 is opened can be controlled to be substantially the same flow rate every time.

Also, during the constant flow rate interval after the occurrence of the burst flow, the control is switched from the pressure feedback to the flow rate feedback, and therefore the flow rate of the gas flowing can be kept at the target constant flow rate. For this reason, even when disturbance such as a variation in gas supply pressure occurs during an ON interval, the flow rate of the gas flowing is less likely to vary, and therefore flow rate control can be made robust. Also, since the constant flow rate is kept after the occurrence of the burst flow, as compared with a case of performing flow rate control so as to follow short-term step input, the rise time necessary for stabilization at a constant flow rate can be shortened to improve response speed in terms of flow rate control.

Further, the flow rate of the gas flowing during an ON interval is determined on the basis of the pressure feedback control and the flow rate feedback control, and therefore can be determined independently of the control accuracy of the length of an ON or OFF interval.

Accordingly, the flow rates of the gas flowing during respective ON intervals when the second valve V2 is opened can be constantly kept at the same value. For this reason, the present embodiment can be preferably used in applications where gas is supplied to a deposition chamber by high-speed pulse control, like ALD.

In addition, the present embodiment requires only one flow path, and does not result in complicating a structure because of the need for multiple flow paths as in the conventional case. Also, no gas is exhausted while the gas is being charged, and therefore waste can be eliminated.

Further, when charging the gas into the volume from the first valve V1 to the second valve V2, the control is first performed by the second pressure feedback controller 12, and then switched to that by the first pressure feedback controller 11, and thereby the time necessary to charge the gas into the entire volume until the target burst pressure is reached can be shortened. As a result, the cycle period of the pulse control can be shortened to shorten the cycle time necessary to form the entire semiconductor layer in the ALD, thus making it possible to improve semiconductor manufacturing throughput.

Figure 5:
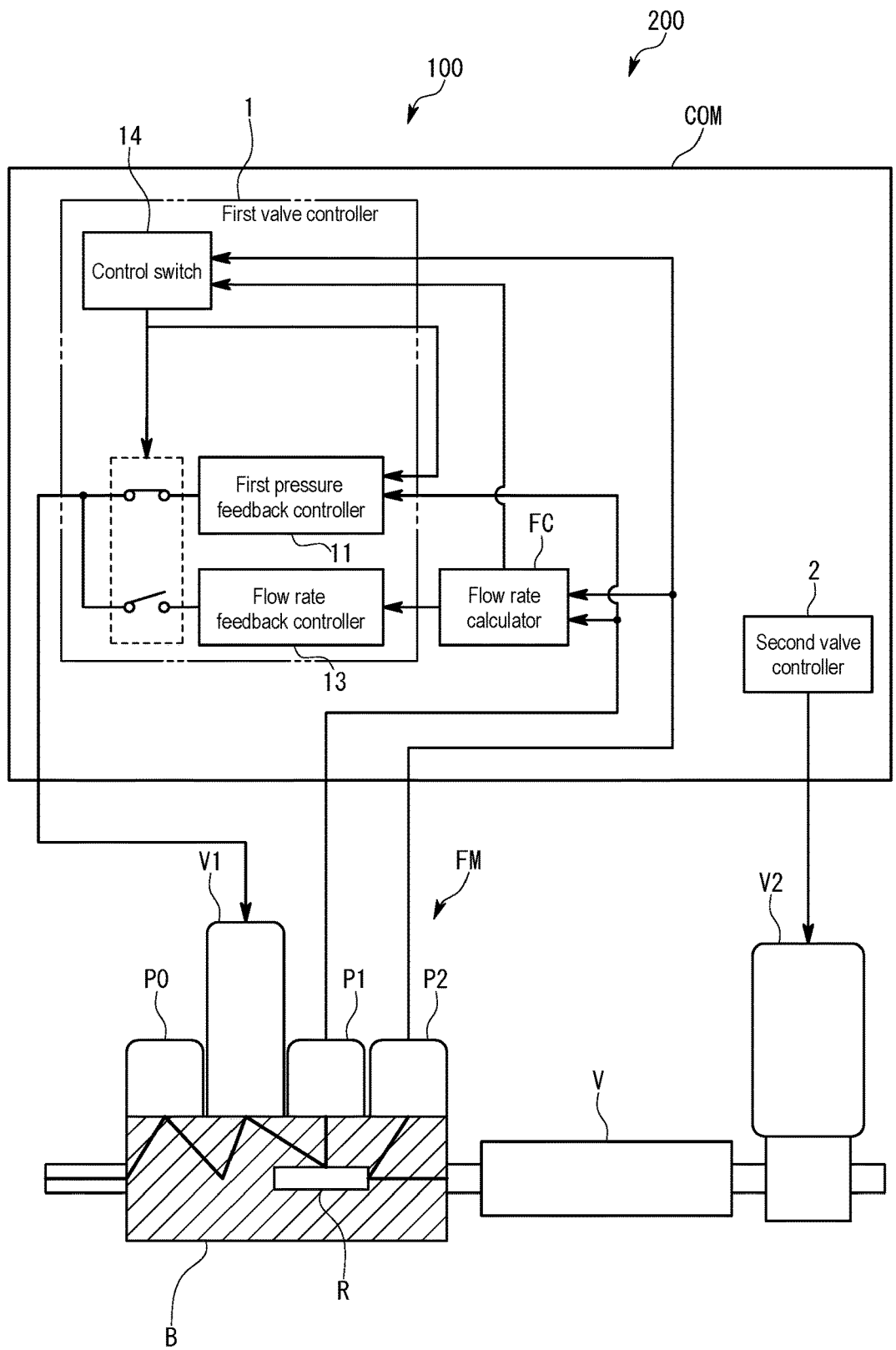
FIG. 5 is a schematic diagram illustrating a fluid control apparatus and a fluid control system according to a second embodiment of the present invention.
Figure 6:
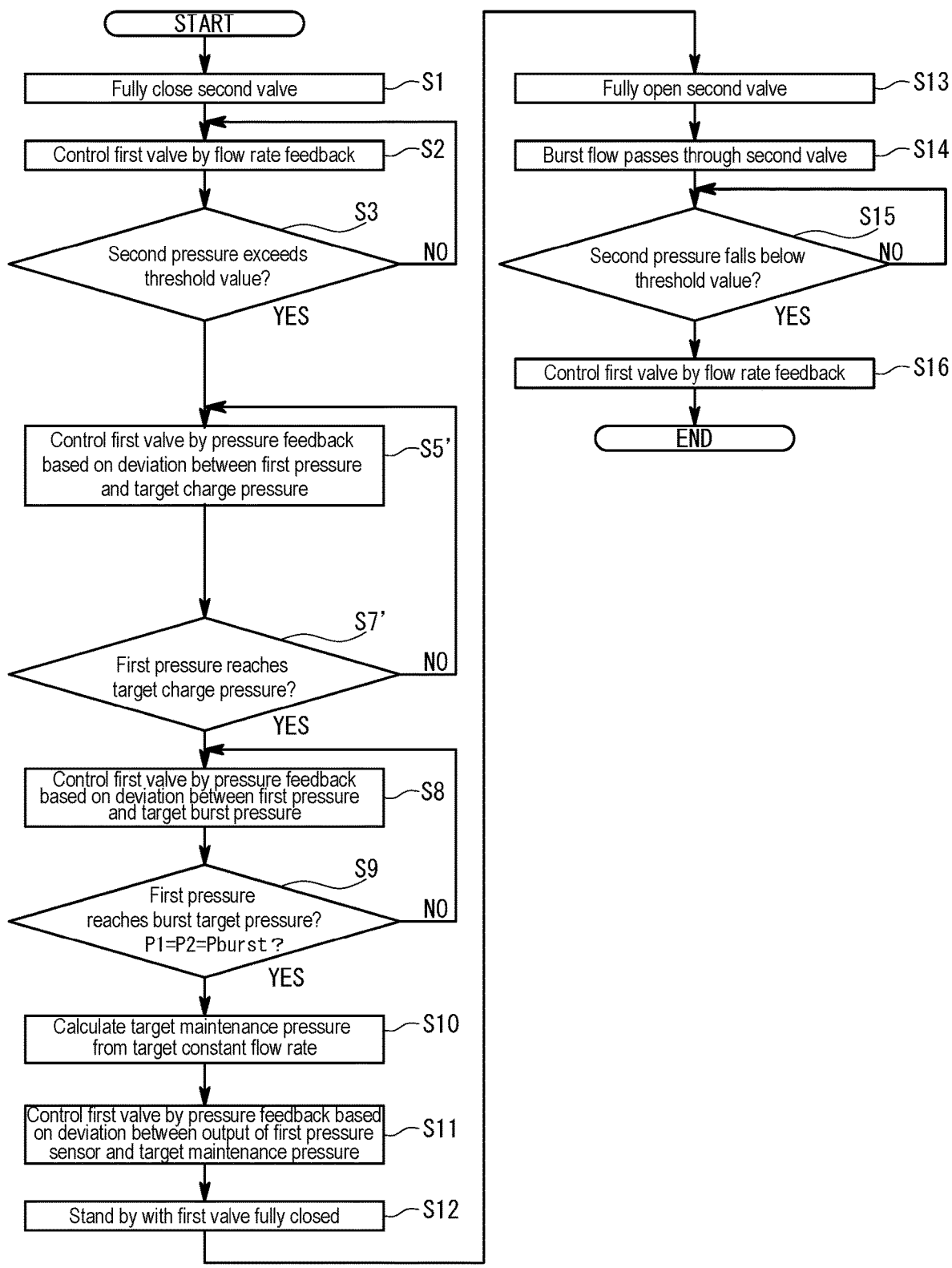
FIG. 6 is a flowchart illustrating the operation of the fluid control apparatus and that of the fluid control system in the second embodiment.

Next, a fluid control system 200 and a fluid control apparatus 100 according to a second embodiment of the present invention will be described with reference to FIGS. 5 and 6. Note that respective parts corresponding to those described in the first embodiment are denoted by the same symbols.

As compared with the first embodiment, the fluid control apparatus 100 of the second embodiment is different in configuration of the control mechanism COM. That is, as illustrated in FIG. 5, in the fluid control apparatus 100 of the second embodiment, the second pressure feedback controller 12 is omitted, and the control switch 14 and the first pressure feedback controller 11 are partially different in configuration. In addition, as can be seen by comparing the flowchart of FIG. 4 illustrating the operation of the first embodiment and that of FIG. 6 illustrating the operation of the second embodiment, in the second embodiment, Steps S4 and S6 in the first embodiment are omitted, and Steps S5 and S7 are different.

In the following, only different points from the first embodiment will be described in detail.

The first pressure feedback controller 11 in the second embodiment controls the operation of the first valve V1 when gas is charged into the volume of the flow path from the first valve V1 to the second valve V2. That is, as illustrated in Step S3 of FIG. 6, when the second pressure exceeds the threshold value, the first pressure feedback controller 11 controls the first valve V1 so as to decrease the deviation between target charge pressure and the first pressure (Step S5'). Note that the target charge pressure is higher than the target burst pressure, and as the target charge pressure, for example, the peak value of the first pressure achieved during the second pressure feedback control interval of FIG. 3 in the first embodiment is set.

When detecting that the first pressure reaches the target charge pressure (Step S7'), the control switch 14 decreases the target pressure of the first pressure feedback controller 11 to the target burst pressure. The subsequent operation of the first pressure feedback controller 11 and that of the control switch 14 are the same as in the first embodiment.

Even the fluid control system 200 and the fluid control apparatus 100 of the second embodiment configured as described above can charge the gas into the entire volume of the flow path from the first valve V1 to the second valve V2 in a short time until the target burst pressure is reached as with the first embodiment.

Further, the target charge pressure required before opening the second valve V2 is charged, the peak flow rates of the gas flowing as burst flow when the second valve V2 is opened in respective ON intervals are made substantially the same, and after the occurrence of the burst flow, the control of the first valve V1 by the flowrate feedback enables the target constant flow rate to be kept.

Accordingly, the second embodiment can also obtain substantially the same effects as the first embodiment.

Figure 7:
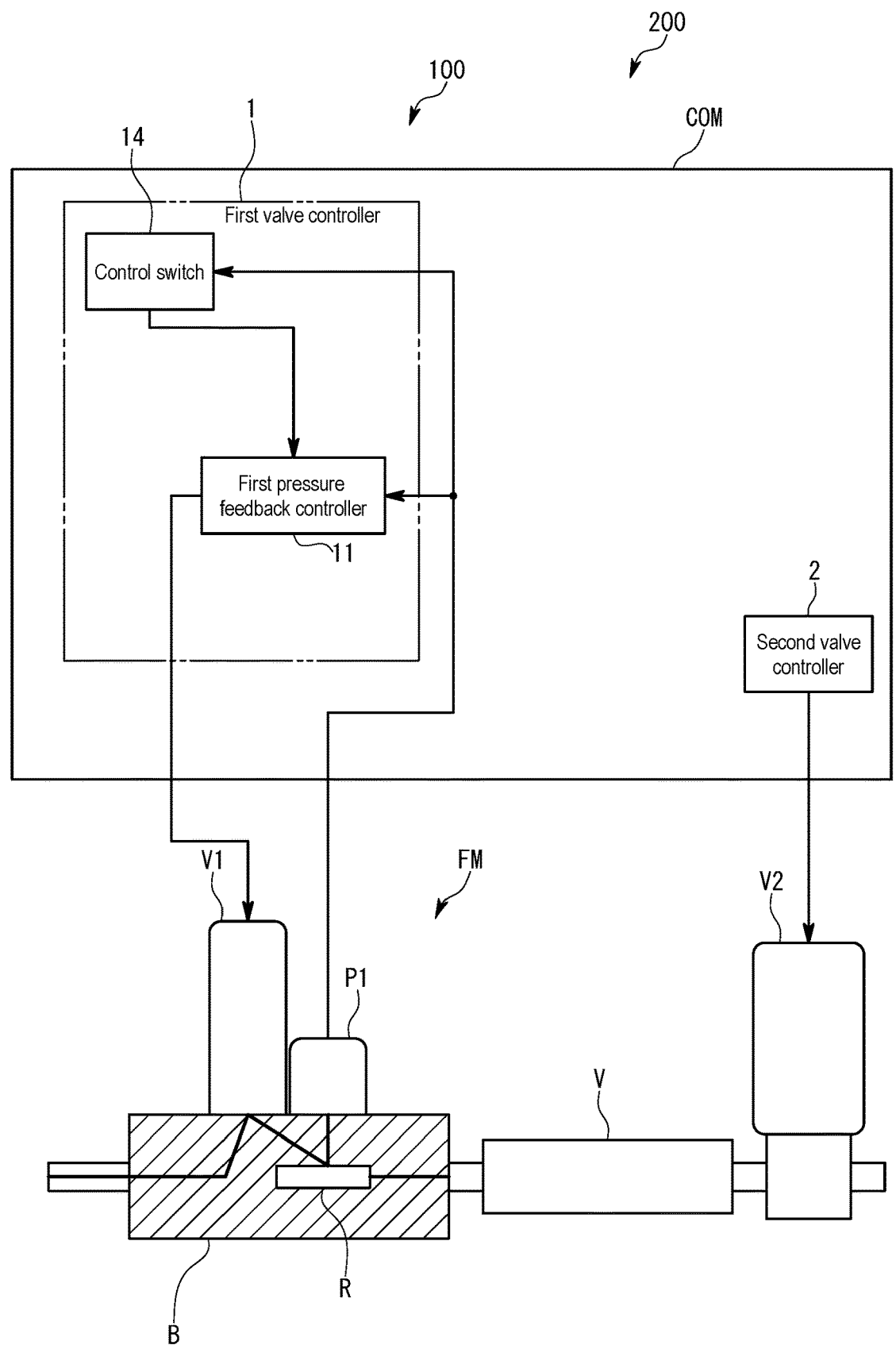
FIG. 7 is a schematic diagram illustrating a fluid control apparatus and a fluid control system according to a third embodiment of the present invention.

Next, a fluid control system 200 and a fluid control apparatus 100 according to a third embodiment of the present invention will be described with reference to FIGS. 7 and 8. Note that respective parts corresponding to those described in the first embodiment are denoted by the same symbols.

As compared with the first embodiment, the fluid control apparatus 100 of the third embodiment is different in configuration of the control mechanism COM. That is, as illustrated in FIG. 7, in the fluid control apparatus 100 of the third embodiment, the supply pressure sensor P0, second pressure sensor P2, second pressure feedback controller 12, flow rate calculator FC, and flow rate feedback controller 13 are omitted, and the control switch 14 and the first pressure feedback controller 11 are partially different in configuration. Also, as can be seen when comparing the flowchart of FIG. 4 illustrating the operation of the first embodiment and that of FIG. 8 illustrating the operation of the third embodiment, in the third embodiment, Steps S2 to S4, S6, and S16 in the first embodiment are omitted, and Steps S5 and S7 are changed to perform the same operation as in the second embodiment. Further, in the third embodiment, the operation in Step S16 in the first embodiment is also different.

That is, the fluid control apparatus 100 of the third embodiment performs control on the basis of only the first pressure, and is configured such that the control switch 14 changes target pressure and thereby a control mode is changed.

In the following, only different points from the first and second embodiments will be described in detail.

The first pressure feedback controller 11 in the third embodiment controls the operation of the first valve V1 when gas is charged into the volume of the flow path from the first valve V1 to the second valve V2. More specifically, the first pressure feedback controller 11 is configured to perform the same operation as in Steps S5' and S7' in the above-described second embodiment.

Figure 8:
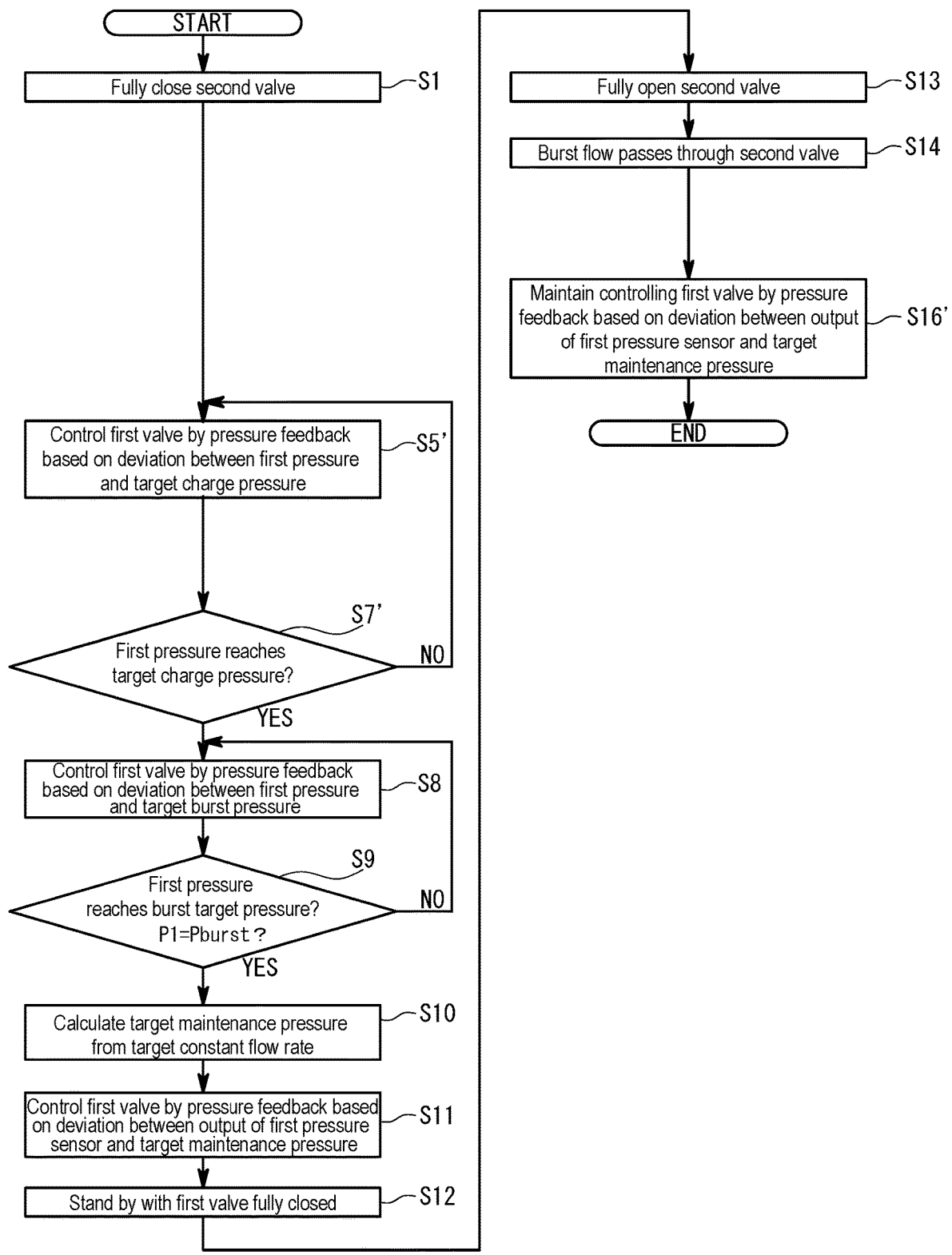
FIG. 8 is a flowchart illustrating the operation of the fluid control apparatus and that of the fluid control system in the third embodiment.

Also, after the second valve V2 has been opened since the gas was charged into the entire volume at the target burst pressure, in the first embodiment, the control by the first pressure feedback controller is switched to the control by the flow rate feedback controller 13, whereas as illustrated in Step S16' of FIG. 8, the control of the first valve 1 is continued by the first pressure feedback controller so that the first pressure reaches the target maintenance pressure corresponding to the target constant flow rate.

Even such a third embodiment can keep the target constant flow rate after the occurrence of burst flow as long as a variation in pressure does not occur on the downstream side of the fluid resistor R, as with the first and second embodiments.

Other embodiments will be described.

The fluid control apparatus may be configured, for example, not to perform the ON/OFF operation of the second valve by omitting the second controller. For example, when ON/OFF of the second valve is controlled with pulses by another system, the fluid control apparatus only has to be configured to acquire a timing signal from the system and make the first valve controller control the first valve in accordance with the timing signal.

Control for making a flow rate constant is not only the control by feeding back the measured flow rate but may be control by feeding back only pressure and keeping pressure on the upstream side of the fluid resistor constant. For example, when the downstream side of the fluid resistor is connected to a deposition chamber being evacuated and the pressure is kept substantially constant, by forming differential pressure corresponding to a flow rate, the flow rate can be substantially controlled. Accordingly, in this specification, flow rate control is defined not only to be that by feeding back a flow rate but also to include that by feeding back pressure.

It is only necessary that the present invention is configured to, when the second valve is opened, during at least part of the interval, keep the target constant flow rate by the flow rate feedback or the pressure feedback. For example, the present invention may be configured such that while the burst flow is occurring, the flow rate feedback controller does not perform the control, and at the point when the flow rate of the gas flowing as the burst flow becomes a predetermined flow rate, starts the flow rate control.

When charging the gas into the entire volume of the flow path from the first valve to the second valve so as to achieve the target burst pressure in the state where the second valve is closed, the first pressure does not necessarily exceed the target burst pressure once as in the respective embodiments. That is, when the second valve is closed, the control of the first valve by the first pressure feedback controller may be continued so as to achieve only the target burst pressure from the beginning without changing a target value.

The fluid resistor is not limited to the laminar flow element but may be an orifice or another resistive element.

The fluid device module is not limited to one in which the first valve, first pressure sensor, fluid resistor, and second pressure sensor are attached to the one block to form the single unit, but may be one in which the respective devices are discretely provided in the flow path to form a module.

The fluid control apparatus according to the present invention is not one applied to only the ALD, but one used for other flow rate control of gas or liquid. In particular, the fluid control apparatus can produce particularly prominent effects particularly on the pulse control of the second valve in which the ON interval and the OFF interval are alternately switched at high speed, and on other such operations.

Besides, various embodiments may be combined and modified without departing from the scope of the present invention.

LIST OF REFERENCE CHARACTERS

200: Fluid control system
100: Fluid control apparatus
FM: Fluid device module
COM: Control mechanism
1: First valve controller
11: First pressure feedback controller
12: Second pressure feedback controller
13: Flow rate feedback controller
14: Control switch
2: Second valve controller
V1: First valve
V2: Second valve
R: Fluid resistor
P1: First pressure sensor
P2: Second pressure sensor

The invention claimed is:
1. A fluid control apparatus comprising:
a fluid device module provided on an upper stream side than a second valve provided in a flow path; and
a control mechanism adapted to control at least a part of the fluid device module, wherein
the fluid device module comprises:
 a fluid resistor provided on the upper stream side than the second valve;
 a first pressure sensor provided on an upper stream side than the fluid resistor; and
 a first valve provided on an upper stream side than the first pressure sensor,
the control mechanism comprises:
 a first pressure feedback controller adapted to control the first valve on a basis of a first pressure measured by the first pressure sensor,
 when the second valve is closed, the first pressure feedback controller controls the first valve so that the first pressure measured by the first pressure sensor reaches a target burst pressure,
 when and after the first pressure reaches the target burst pressure and the second valve is opened, the control mechanism is configured to control the first valve so that a flow rate of fluid flowing through the flow path reaches a target constant flow rate, and
 the target burst pressure is higher than a target maintenance pressure, the target maintenance pressure being a target value of a pressure of the fluid that is set depending on the target constant flow rate.
2. The fluid control apparatus according to claim 1, wherein
the fluid device module further comprises:
 a second pressure sensor provided on a lower stream side than the fluid resistor and on the upper stream side than the second valve, the control mechanism further comprises:
- a flow rate calculator adapted to calculate the flow rate of the fluid flowing through the flow path on a basis of the first pressure measured by the first pressure sensor and second pressure measured by the second pressure sensor; and
- a flow rate feedback controller adapted to control the first valve on a basis of a measured flow rate calculated by the flow rate calculator, and
- when and after the first pressure reaches the target burst pressure and the second valve is opened, the flow rate feedback controller controls the first valve so that the measured flow rate reaches the target constant flow rate.

3. The fluid control apparatus according to claim 2, wherein the control mechanism further comprises:
- a second pressure feedback controller adapted to, before the first pressure feedback controller controls the first valve, control the first valve on a basis of the second pressure measured by the second pressure sensor, and
- when and after the first pressure reaches pressure higher than the target burst pressure, the first pressure feedback controller controls the first valve so that the first pressure reaches the target burst pressure.

4. The fluid control apparatus according to claim 3, wherein when mass of the fluid flowing into a charge volume from the first valve to the second valve reaches target mass calculated on a basis of the target burst pressure, the mass being calculated on a basis of the first pressure and the second pressure, the first pressure feedback controller starts to control the first valve so that the first pressure reaches the target burst pressure.

5. The fluid control apparatus according to claim 1, wherein when and after the second valve is closed and the first pressure reaches the target burst pressure, the first pressure feedback controller controls the first valve so that the first pressure reaches the target maintenance pressure.

6. The fluid control apparatus according to claim 1, wherein the control mechanism further comprises:
- a second valve controller adapted to control the second valve, and
- the second valve controller is configured to open the second valve when and after the first pressure feedback controller controls the first valve and thereby the first pressure reaches the target burst pressure.

7. A fluid control system comprising:
- the fluid control apparatus according to claim 1; and
- the second valve.

8. A fluid control method using a fluid control apparatus comprising: a fluid device module provided on an upper stream side than a second valve provided in a flow path; and a control mechanism adapted to control at least a part of the fluid device module, wherein the fluid device module comprises: a fluid resistor provided on the upper stream side than the second valve; a first pressure sensor provided on an upper stream side than the fluid resistor; and a first valve provided on an upper stream side than the first pressure sensor, the fluid control method comprising:
- when the second valve is closed, controlling the first valve so that a first pressure measured by the first pressure sensor reaches a target burst pressure, and
- when and after the first pressure reaches the target burst pressure and the second valve is opened, controlling the first valve so that a flow rate of fluid flowing through the flow path reaches a target constant flow rate, wherein
- the target burst pressure is higher than a target maintenance pressure, the target maintenance pressure being a target value of a pressure of the fluid that is set depending on the target constant flow rate.

9. A non-transitory program recording medium recorded with a program used for a fluid control apparatus comprising: a fluid device module provided on an upper stream side than a second valve provided in a flow path; and a control mechanism adapted to control at least a part of the fluid device module, wherein the fluid device module comprises: a fluid resistor provided on the upper stream side than the second valve; a first pressure sensor provided on an upper stream side than the fluid resistor; and a first valve provided on an upper stream side than the first pressure sensor,
- the program instructing a computer to fulfill a function as a first valve controller adapted to control the first valve, wherein
- the first valve controller comprises a first pressure feedback controller adapted to control the first valve on a basis of a first pressure measured by the first pressure sensor,
- when the second valve is closed, the first pressure feedback controller controls the first valve so that the first pressure measured by the first pressure sensor reaches a target burst pressure,
- when and after the first pressure reaches the target burst pressure and the second valve is opened, the first valve controller controls the first valve so that a measured flow rate reaches a target constant flow rate, and
- the target burst pressure is higher than a target maintenance pressure, the target maintenance pressure being a target value of a pressure of the fluid that is set depending on the target constant flow rate.

\* \* \* \* \*